US009551071B2

(12) United States Patent
Hanamachi et al.

(10) Patent No.: US 9,551,071 B2
(45) Date of Patent: Jan. 24, 2017

(54) SUBSTRATE SUPPORT DEVICE (71) Applicant: NHK SPRING CO., LTD., Kanagawa (JP)

(72) Inventors: Toshihiko Hanamachi, Kanagawa (JP); Daisuke Hashimoto, Kanagawa (JP); Yasuaki Ishioka, Kanagawa (JP)

(73) Assignee: NHK SPRING CO., LTD., Kanagawa (JP)

( * ) Notice: Subject to any disclaimer, the term of this patent is extended or adjusted under 35 U.S.C. 154(b) by 0 days.

(21) Appl. No.: 14/845,865

(22) Filed: Sep. 4, 2015

(65) Prior Publication Data

US 2015/0376783 A1    Dec. 31, 2015

Related U.S. Application Data (63) Continuation of application No. PCT/JP2014/053142, filed on Feb. 12, 2014.

(30) Foreign Application Priority Data

Mar. 8, 2013    (JP) .................................. 2013-047164

(51) Int. Cl.
*C23C 16/458*    (2006.01)
*H01L 21/67*    (2006.01)
(Continued)

(52) U.S. Cl.
CPC ......... *C23C 16/4586* (2013.01); *C23C 16/463* (2013.01); *H01L 21/67109* (2013.01);
(Continued)

(58) Field of Classification Search
None
See application file for complete search history.

(56) References Cited

U.S. PATENT DOCUMENTS

2004/0097088 A1    5/2004    Kitayama et al.
2007/0029740 A1    2/2007    Natsuhara et al.
(Continued)

FOREIGN PATENT DOCUMENTS

JP    2001-507868 A    6/2001
JP    2002-217178 A    8/2002
(Continued)

OTHER PUBLICATIONS

Japanese Notice of Allowance issued on Jun. 29, 2016 for the corresponding Japanese application No. 2013-047164.
International Search Report dated Apr. 22, 2014 regarding a corresponding International Patent Application No. PCT/JP2014/053142.
Written Opinion of International Search Authority dated Apr. 22, 2014 regarding a corresponding International Patent Application No. PCT/JP2014/053142.
(Continued)

*Primary Examiner* — Dah-Wei D Yuan
*Assistant Examiner* — Jethro M Pence
(74) *Attorney, Agent, or Firm* — Typha IP LLC (57) ABSTRACT

A substrate support device includes a plate portion including a heater plate that includes a heating element provided in the heater plate, and also including a first cooling plate provided on a bottom surface of the heater plate and having a first flow path, and a second cooling plate provided on a top surface of the heater plate and having a second flow path; and a shaft portion supporting the plate portion and including a line connected to the heating element to supply an electric current to the heating element, and a tube supplying a coolant to the first cooling plate and the second cooling plate, the line and the tube being provided inside the shaft portion.

13 Claims, 5 Drawing Sheets (51) Int. Cl.
*H01L 21/687* (2006.01)
*C23C 16/46* (2006.01)
*B05C 21/00* (2006.01)

(52) U.S. Cl.
CPC .. *H01L 21/68785* (2013.01); *H01L 21/68792* (2013.01); *B05C 21/00* (2013.01)

(56) References Cited

U.S. PATENT DOCUMENTS

| | | |
|---|---|---|
| 2007/0039942 A1 | 2/2007 | Leung et al. |
| 2009/0250202 A1 | 10/2009 | Eibl |
| 2011/0189602 A1* | 8/2011 | Tadokoro ................ B05C 21/00 430/30 |
| 2013/0112328 A1* | 5/2013 | Hinque ................... B60C 19/04 152/450 |
| 2013/0134148 A1* | 5/2013 | Tachikawa ........ H01L 21/67103 219/444.1 |

FOREIGN PATENT DOCUMENTS

| | | |
|---|---|---|
| JP | 2003-324095 A | 11/2003 |
| JP | 2006-332518 A | 12/2006 |
| JP | 2007-035878 A | 2/2007 |
| JP | 2007-043042 A | 2/2007 |
| JP | 2007-053382 A | 3/2007 |
| JP | 2009-065033 A | 3/2009 |
| JP | 2009-512224 A | 3/2009 |
| JP | 2011-049196 A | 3/2011 |
| JP | 2011-082405 A | 4/2011 |
| KR | 10-2012-0092473 A | 8/2012 |

OTHER PUBLICATIONS

South Korean Office Action mailed on Oct. 13, 2016 for the corresponding Korean application No. 10-2015-7024229, with Machine Translation.

* cited by examiner

SUBSTRATE SUPPORT DEVICE

CROSS-REFERENCE TO RELATED APPLICATIONS

This application is based upon and claims the benefit of priority from the prior Japanese Patent Application No. 2013-047164, filed on Mar. 8, 2013, and PCT Application No. PCT/JP2014/053142, filed on Feb. 12, 2014, the entire contents of which are incorporated herein by reference.

FIELD

The present invention relates to a substrate support device usable to produce a semiconductor device, and particularly to a substrate support device including a built-in heating element.

BACKGROUND

In production of a semiconductor device, processing steps such as a chemical vapor deposition (CVD) step, a surface modification step and the like are performed by use of a semiconductor production device including a substrate support device that supports a wafer, which is a semiconductor substrate. For heating the wafer, a substrate support device including a built-in heating element is used.

Such a substrate support device has a structure in which a plate formed of a metal or ceramic material is supported by a shaft. The substrate support device operates by the following mechanism. The plate includes a plasma electrode or a heating element provided therein. When an electric current is supplied to the heating element via a line located inside the shaft, the heating element is heated, and the wafer is heated by the heat generated in the heating element.

The wafer located on such a plate may possibly have a temperature higher than a desired temperature. In order to avoid this, a conventional substrate support device has a flow path formed in a wafer holder that holds the wafer, and supplies a fluid to the flow path so that the wafer holder is cooled to adjust the temperature of the wafer (see, for example, Japanese Laid-Open Patent Publication No. 2007-43042).

However, the above-described conventional substrate support device has the flow path for cooling located in only one surface of the plate. Therefore, it is difficult to uniformly heat the plate, and the plate itself may be deformed or may have any other fault due to thermal strain of the plate. This may cause malfunction of the substrate support device. In addition, the temperature of the wafer placed on the plate may be varied in the plane thereof. In the state where there is temperature variance in the plane of the wafer, the wafer may be curved or may have any other fault, which may decrease the yield of the semiconductor devices.

The present invention made to solve the above-described problems has an object of providing a substrate support device that, for heating a wafer, uniformly heats a heater plate so that the heater plate is not deformed or does not have any other fault due to thermal strain, and so that the temperature uniformity of the wafer is improved.

SUMMARY

An embodiment of the present invention provides a substrate support device including: a plate portion including a heater plate including a heating element provided in the heater plate, a first cooling plate provided on a bottom surface of the heater plate and having a first flow path, and a second cooling plate provided on a top surface of the heater plate and having a second flow path; and a shaft portion supporting the plate portion and including a line connected to the heating element to supply an electric current to the heating element, and a tube supplying a coolant to the first cooling plate and the second cooling plate, the line and the tube being provided inside the shaft portion. The first flow path includes a spiral flow path wound circumferentially in a first direction from a central area toward an outer edge portion of the first cooling plate; and the second flow path includes a spiral flow path wound circumferentially in a second direction from a central area toward an outer edge portion of the second cooling plate, the second direction being opposite to the first direction.

The substrate support device may further include a first coupling tube coupling the first flow path and the second flow path to each other to supply the coolant from the first flow path to the second flow path. The first flow path may include a portion bent horizontally at a first angle at a position where the first flow path is coupled with the first coupling tube.

The substrate support device may further include a second coupling tube coupling the first flow path and the second flow path to each other to supply the coolant from the second flow path to the first flow path. The first flow path may include a portion bent horizontally at a second angle at a position where the first flow path is coupled with the second coupling tube.

In the substrate support device, the first angle and the second angle may be each 90 degrees.

In the substrate support device, the first flow path may further include a spiral flow path coupled at the outer edge portion with the spiral flow path wound circumferentially in the first direction, and wound circumferentially in the second direction from the outer edge portion toward the central area; the second flow path may further include a spiral flow path coupled at the outer edge portion with the spiral flow path wound circumferentially in the second direction, and wound circumferentially in the first direction from the outer edge portion toward the central area; the spiral flow path, of the first flow path, wound circumferentially in the first direction, and the spiral flow path, of the second flow path, wound circumferentially in the first direction, may be located to overlap each other at least partially; and the spiral flow path, of the first flow path, wound circumferentially in the second direction, and the spiral flow path, of the second flow path, wound circumferentially in the second direction, may be located to overlap each other at least partially.

In the substrate support device, the second flow path may have a cross-sectional area larger than a cross-sectional area of the first flow path.

REFERENCE SIGNS LIST

100:First cooling plate, 101:First substrate, 110:First flow path, 200:Second cooling plate, 201:Second substrate, 210: Second flow path, 300:Plate portion, 301:Heater plate, 310: Heating element, 400:Shaft portion, 20A, 20B, 21A, 21B: Coupling tube.

DESCRIPTION OF EMBODIMENTS

Hereinafter, a substrate support device in an embodiment according to the present invention will be described with reference to the drawings. The following embodiment describes merely an example of substrate support device according to the present invention, and the substrate support device according to the present invention is not limited to the following embodiment.

(Structure of the Substrate Support Device)

Figure 4:
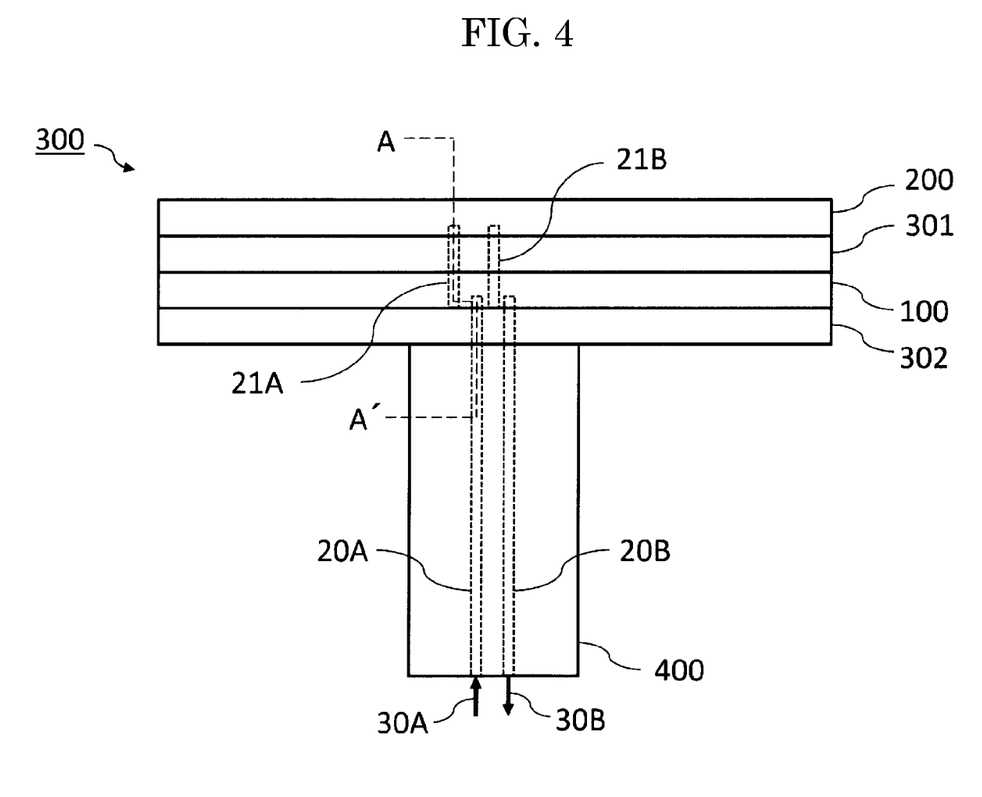
FIG. 4 is a cross-sectional view schematically showing a general structure of the substrate support device in an embodiment according to the present invention.
Figure 5:
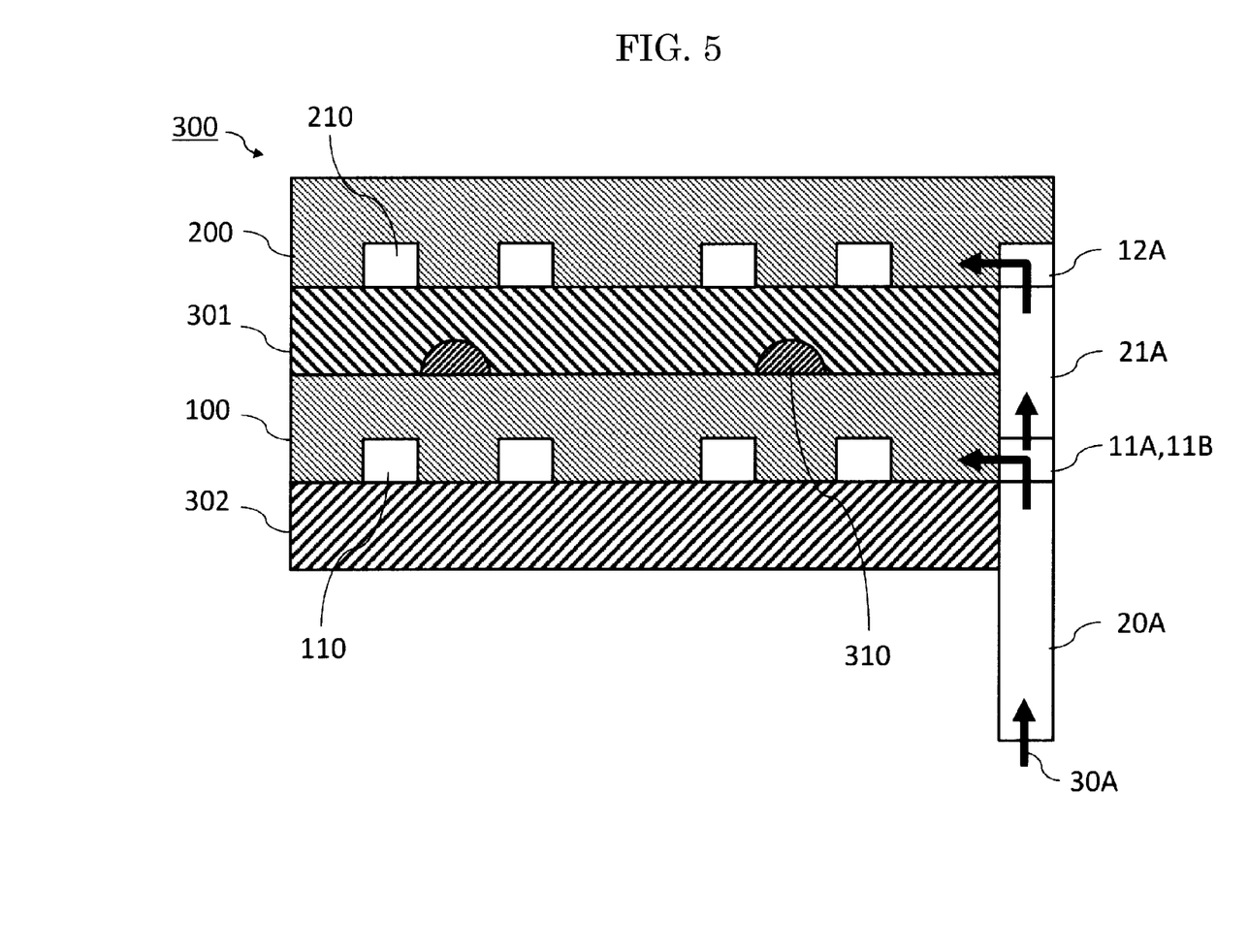
FIG. 5 is a cross-sectional view taken along line A-A' that shows a general structure of the plate portion 300 shown in FIG. 4.

Hereinafter, with reference to FIG. 4 and FIG. 5, a general structure of a substrate support device in an embodiment according to the present invention will be described. FIG. 4 is a cross-sectional view schematically showing a general structure of the substrate support device in an embodiment according to the present invention. FIG. 5 is a cross-sectional view taken along line A-A' in FIG. 4, and shows a general structure of a plate portion 300.

As shown in FIG. 4, the substrate support device in this embodiment includes the plate portion 300 and a shaft portion 400. The plate portion 300 includes a heater plate 301 including a heating element 310 (see FIG. 5) provided therein, a first cooling plate 301 located on a bottom surface of the heater plate 301, a second cooling plate provided on a top surface of the heater plate 301, and a third substrate 302 located on a bottom surface of the first cooling plate 100. Although not shown, an insulating film may be formed on a surface of the plate portion 300 that supports a wafer and on a side surface of the plate portion 300, and a recessed portion may be formed in the surface of the plate portion 300 that supports the wafer.

The shaft portion 400 is connected to a central area the plate portion 300 on a surface of the plate portion 300 that is opposite to the surface that supports the wafer. The shaft portion 400 supports the plate portion 300. Although not shown, the shaft portion 400 is generally cylindrical and is hollow. The inner space of the hollow shaft portion 400 accommodates a line connected to the heating element 310 to connect the heating element 310 with an external control device. The line supplies an electric current to the heating element 310. As shown in FIG. 4, the shaft portion 400 may accommodate a coupling tube 20A that supplies a coolant to the first cooling plate 100 and the second cooling plate 200, and a coupling tube 20B that discharges the coolant from the first cooling plate 100 and the second cooling plate 200.

The plate portion 300 and the shaft portion 400 in this embodiment are formed of, for example, a metal material. The metal material to be used may be selected from known materials usable to produce a substrate support device. Such known materials include, for example, aluminum, stainless steel, copper, nickel, titanium and the like. The plate portion 300 and the shaft portion 400 are not limited to being formed of a metal material, and may be formed of, for example, a ceramic material or the like.

The plate portion 300 has a structure in which the second cooling plate 200 and the heater plate 301 are joined together, the heater plate 301 and the first cooling plate 100 are jointed together, and the first cooling plate 100 and the third substrate 302 are joined together, by brazing or welding. The first cooling plate 100 and the second cooling plate 200 each have a groove that is to act as a flow path. As shown in FIG. 5, the first cooling plate 100 and the third substrate 302 are joined together to form a first flow path 110, and the second cooling plate 200 and the heater plate 301 are joined together to form a second flow path 210. The first flow path 110 and the second flow path 210 are not each limited to having a square cross-section as shown in FIG. 5, and may have, for example, a circular or triangular cross-section.

The first flow path 110 and the second flow path 210 form a mechanism that adjusts the temperature of the heater plate 301 located between the first cooling plate 100 and the second cooling plate 200 by refluxing the coolant. As the coolant, inert gas such as nitrogen or the like is used. The coolant is not limited to nitrogen, and may be a gas such as air or the like or a liquid such as oil, an aqueous solution of ethylene glycol, water or the like.

In FIG. 4 and FIG. 5, a direction in which the coolant flows in is represented by arrow 30A, and a direction in which the coolant flow out is represented by arrow 30B. As shown in FIG. 4 and FIG. 5, the coolant is supplied to the first cooling plate 100 via the coupling tube 20A coupled with the first flow path 110, and is supplied to the second cooling plate 200 via a coupling tube 21A that couples the first flow path 110 and the second flow path 210 to each other. The coolant which has refluxed in the second flow path 210 passes a coupling tube 21B that couples the first flow path 110 and the second flow path 210 to each other, and then is discharged via the coupling tube 20B coupled with the first flow path 110, together with the coolant which has refluxed in the first flow path.

As shown in FIG. 4 and FIG. 5, the coolant is supplied to the first cooling plate 100 via the coupling tube 20A located inside the shaft portion 400 and the third substrate 302, and then is supplied to the second cooling plate 200 via the coupling tube 21A located inside the first cooling plate 100 and the heater plate 301. The coolant which has refluxed in the second flow path 210 in the second cooling plate 200 passes the coupling tube 21B located inside the first cooling plate 100 and the heater plate 301 to join with the coolant which has refluxed in the first flow path 110 in the first cooling plate 100, and the coolant is discharged via the coupling tube 20B located inside the shaft portion 400 and the third substrate 302. Although not shown, the coupling tubes 20A and 20B may be coupled with a coolant supply device and a coolant recovery device, respectively.

(Structure of the Plate Portion 300)

Figure 1:
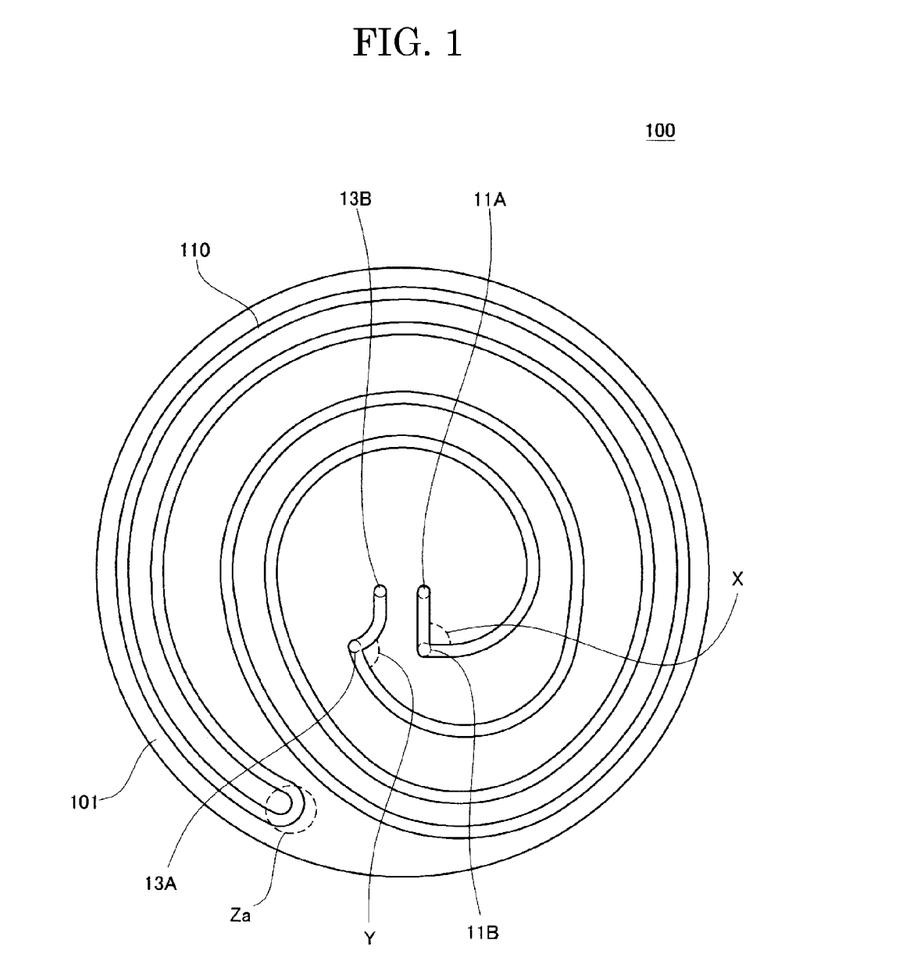
FIG. 1 is a plan view showing a first cooling plate of a substrate support device in an embodiment according to the present invention.
Figure 2:
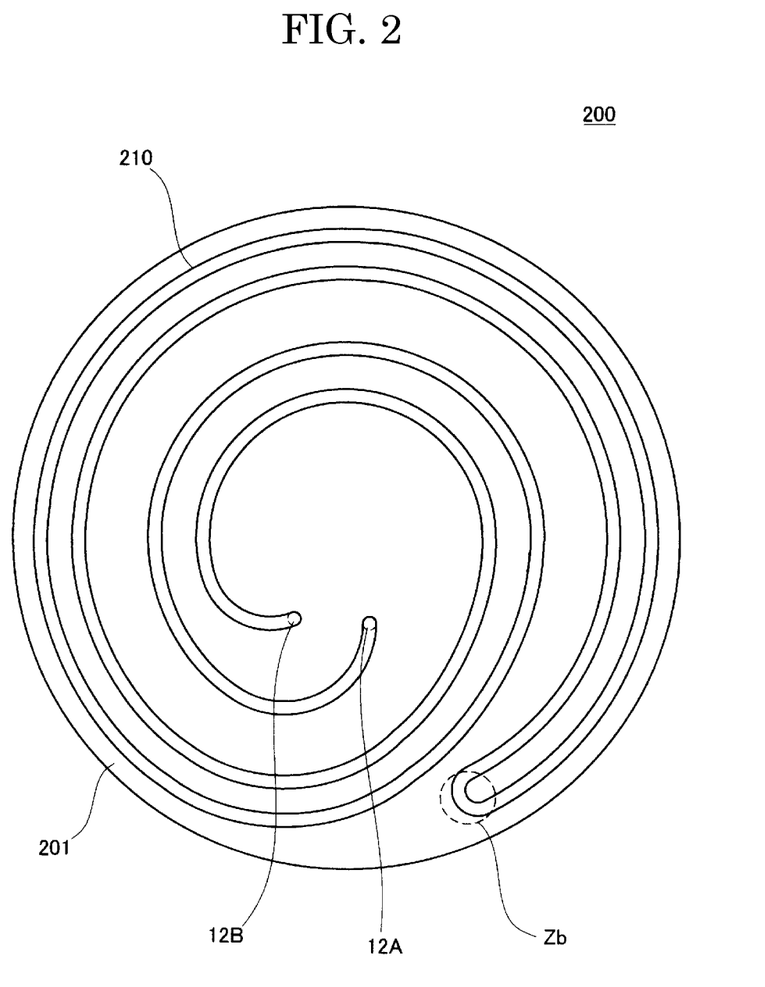
FIG. 2 is a plan view showing a second cooling plate of the substrate support device in an embodiment according to the present invention.
Figure 3:
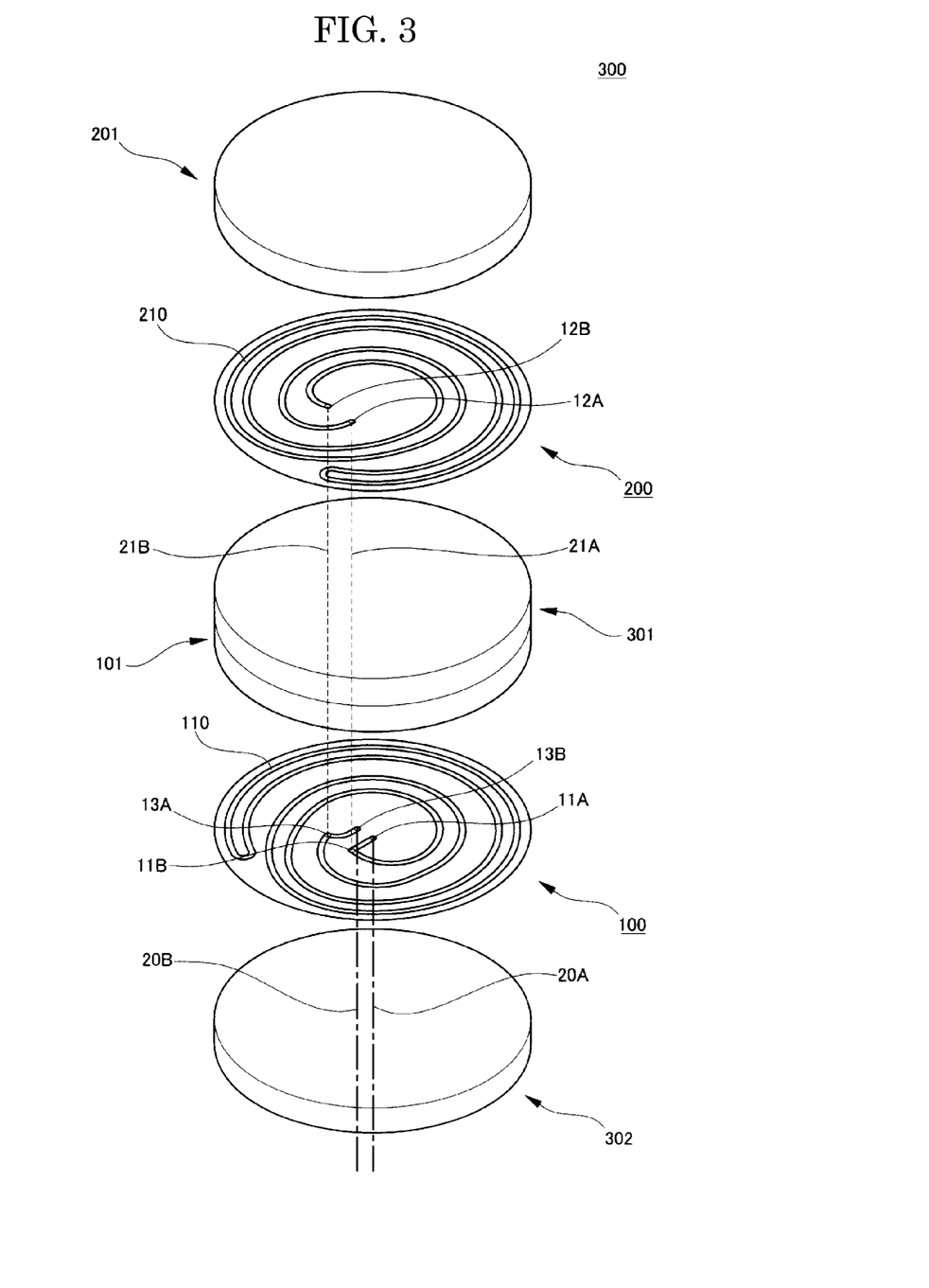
FIG. 3 is an exploded perspective view of a plate portion of substrate support device in an embodiment according to the present invention.

Hereinafter, with reference to FIG. 1 through FIG. 3, the structure of the plate portion 300 in the substrate support device in an embodiment according to the present invention will be described in more detail. FIG. 1 is a plan view showing the first cooling plate 100 in the substrate support device in an embodiment according to the present invention. FIG. 2 is a plan view showing a second cooling plate 200 in the substrate support device in an embodiment according to the present invention. FIG. 3 is an exploded perspective view showing the plate portion 300 in the substrate support device in an embodiment according to the present invention.

(Structure of the First Cooling Plate 100)

With reference to FIG. 1 and FIG. 3, a structure of the first cooling plate 100, among the components of the plate portion 300, will be described. As shown in FIG. 1 and FIG. 3, the first cooling plate 100 has a structure in which the first flow path 110 is formed in the form of a groove in a surface of a first substrate 101 having a generally cylindrical shape. The surface of the first cooling plate 100 in which the first flow path 110 is formed is joined with the third substrate 302, and a surface facing the surface joined with the third substrate 302 is joined with the heater plate 301.

As shown in FIG. 1 and FIG. 3, the first flow path 110 includes a coupling portion 11A at which the first flow path 110 is connected with the coupling tube 20A, through which the coolant is supplied; a coupling portion 11B at which the first flow path 110 is connected with the coupling tube 21A, which couples the first flow path 110 and the second flow path 210 to each other; a coupling portion 13A at which the first flow path 110 is connected with the coupling tube 21B, which couples the first flow path 110 and the second flow path 210 to each other; and a coupling portion 13B at which the first flow path 110 is connected with the coupling tube 20B, through which the coolant is discharged. The coupling portion 11A is a coolant inlet through which the coolant which has passed the coupling tube 20A flows into the first flow path 110, and is located in a generally central area of a generally circular surface of the first substrate 101. The coupling portion 13B is a coolant outlet through which the coolant which has refluxed in the first flow path 110 is discharged from the first flow path 110, and is located in the generally central area of the surface of the first substrate 101, adjacent to the coupling portion 11A.

As shown in FIG. 1, the first flow path 110 extends generally straight from the coupling portion 11A to the coupling portion 11B, is bent at angle X horizontally at the coupling portion 11B, is wound spirally and circumferentially counterclockwise to an outer edge portion Za of the first substrate 101, is wound spirally and circumferentially clockwise from the outer edge portion Za along and, outer to, the counterclockwise spiral part to the coupling portion 13A, is bent at angle Y horizontally at the coupling portion 13A, and extends to the coupling portion 13B. Therefore, the coolant flows, from the coupling portion 11A as the coolant inlet, in a generally spiral part of the first flow path 110 that is wound counterclockwise, then flows, from the outer edge portion Za of the first substrate 101, in a generally spiral part of the first flow path 110 that is wound clockwise, and flows out from the coupling portion 13B as the coolant outlet.

As shown in FIG. 3, the flow path for the coolant flowing in from the coupling portion 11A is branched at the coupling portion 11B into the first flow path 110 extending in the horizontal direction and the coupling tube 21A extending upward. The coolant passes the coupling tube 21A from the coupling portion 11B of the first flow path 110, and flows into the second flow path 210 in the second cooling plate 200. The coupling tube 21A connected to the second flow path 210 extends in a vertical direction and is connected with the first flow path 110 at an angle of about 90 degrees at the coupling portion 11B of the first flow path 110. Therefore, the angle X at which the first flow path 110 is bent horizontally at the coupling portion 11B may be about 90 degrees, so that no pressure difference is caused between in the vertical direction and in the horizontal direction. In this manner, the flow rate of the coolant may be distributed substantially equally to the coupling tube 21A and the first flow path 110 with no excessive difference.

The first flow path 110 is bent at angle Y horizontally also at the coupling portion 13A. The coupling portion 13A is a point at which the coolant which has refluxed in the second flow path 200 in the second coolant plate 200 and passed the coupling tube 21B is joined with the coolant which has refluxed in the first flow path 110. The angle Y at which the first flow path 110 is bent horizontally at the coupling portion 13A may also be about 90 degrees, so that no pressure difference is caused in a part from the coupling portion 13A to the coupling portion 13B, between in the coolant which has refluxed in the first flow path 110 and in the coolant which has refluxed in the second flow path 210 and passed the coupling tube 21B and is to flow vertically into the first flow path 110. Therefore, at the coupling portion 13A also, there is no excessive difference in the flow rate between the coolant flowing toward the coupling portion 13B as the coolant outlet after refluxing in the second flow path 210, and the coolant flowing toward the coupling portion 13B as the coolant outlet after refluxing in the first flow path 110.

The angle X at which the first flow path 110 is bent horizontally at the coupling portion 11B, and the angle Y at which the first flow path 110 is bent horizontally at the coupling portion 13A, are not limited to 90 degrees and may be appropriately adjusted to any angle in accordance with the specifications, as long as the flow rate of the parts of the coolant in the first flow path 110 and the second flow path 210 may be adjusted as desired.

With the substrate support device in an embodiment according to the present invention, the second flow path 210 in the second cooling plate 200 located on the upper side of the plate portion 300 may have a larger cross-sectional area than that of the first flow path 110 in the first cooling plate 100 located on the lower side of the plate portion 300, so that a larger amount of coolant is supplied to the second cooling plate 200. Namely, in the case where the cross-sectional area of the second flow path 210 is made larger than the cross-sectional area of the first flow path 110, the coolant flows into the second flow path 210 easily and thus the flow rate of the coolant that is supplied to the second cooling plate 200 is allowed to be increased. Alternatively, the coupling tube 21A that couplies the first flow path 110 and the second flow path 210 to each other may have a larger cross-sectional area than that of the first flow path 110, so that the coolant may flow into the second flow path 210 easily.

Still alternatively, the second flow path 210 in the second cooling plate 200 may be made longer than the first path 110 in the first cooling plate 100, so that a higher flow rate of coolant is supplied to the second cooling plate 200. In this manner, the substrate support device in an embodiment according to the present invention adjusts the flow rate of the coolant to be supplied to each of the first cooling plate 100 and the second cooling plate 200 by appropriately adjusting the cross-sectional area or the length of each of the first flow path 110, the second flow path 210, and the coupling tubes 20A, 20B, 21A and 21B.

(Structure of the Second Cooling Plate 200)

With reference to FIG. 2 and FIG. 3, a structure of the second cooling plate 200, among the components of the plate portion 300, will be described. As shown in FIG. 2 and FIG. 3, the second cooling plate 200 has a structure in which the second flow path 210 is formed in the form of a groove in a surface of a second substrate 201 having a generally cylindrical shape. A surface of the second cooling plate 200 in which the second flow path 210 is formed is joined with the heater plate 301, and a wafer is placed on a surface facing the surface joined with the heater plate 301.

As shown in FIG. 2 and FIG. 3, the second flow path 210 includes a coupling portion 12A at which the second flow path 210 is connected with the coupling tube 21A, through which the coolant is supplied; and a coupling portion 12B at which the second flow path 210 is connected with the coupling tube 21B, through which the coolant is discharged. The coupling portion 12A is a coolant inlet through which the coolant which has passed the coupling tube 21A flows into the second flow path 210, and is located in a generally central area of a generally circular surface of the second substrate 201. The coupling portion 12B is a coolant outlet through which the coolant which has refluxed in the second flow path 210 is discharged from the second flow path 210, and is located in the generally central area of the surface of the second substrate 201, adjacent to the coupling portion 12A. The coupling portion 12A and the coupling portion 12B of the second flow path 210 are respectively located at positions with which the second flow path 210 are connected to the coupling portion 11B and the coupling portion 13A of the first flow path 110 via the coupling tube 21A and the coupling tube 21B.

As shown in FIG. 2, the second flow path 210 is wound spirally and circumferentially clockwise from the coupling portion 12A to an outer edge portion Zb of the second substrate 201, and is wound spirally and circumferentially counterclockwise from the outer edge portion Zb along, and inner to, the clockwise spiral part to the coupling portion 12B. Therefore, the coolant flows, from the coupling portion 12A as the coolant inlet, in a generally spiral part of the second flow path 210 that is wound clockwise, then flows, from the outer edge portion Zb of the second substrate 201, in a generally spiral part of the second flow path 210 that is wound counterclockwise, and flows out from the coupling portion 12B as the coolant outlet.

As described above, the second flow path 210 is structured such that the spiral part in which the coolant flows clockwise from the coupling portion 12A as the coolant inlet to the outer edge portion Zb is located along, and outer to, the spiral part in which the coolant flows counterclockwise from the outer edge portion Zb to the coupling portion 12B as the coolant outlet. The first flow path 110 described above with reference to FIG. 1 is structured such that the spiral part in which the coolant flows clockwise from the outer edge portion Za to the coupling portion 13B as the coolant outlet is located along, and outer to, the spiral part in which the coolant flows counterclockwise from the coupling portion 11A as the coolant inlet to the outer edge portion Za. Owing to such a structure, a part of the second flow path 210 in which the coolant having a high temperature flows above a part of the first flow path 110 in which the coolant having a low temperature flows; whereas a part of the second flow path 210 in which the coolant having a low temperature flows above a part of the first flow path 110 in which the coolant having a high temperature flows.

This will be described specifically. The first flow path 110 and the second flow path 210 are structured such that the temperature of the coolant is low in the vicinity of the coupling portion 11A and the coupling portion 12A, which are each the coolant inlet, and such that the temperature of the coolant is high in the vicinity of the coupling portion 13B and the coupling portion 12B, which are each the coolant outlet as a result of the coolant refluxing in the respective flow paths. Therefore, the spiral part of the second flow path 210 from the coupling portion 12A as the coolant inlet to the outer edge portion Zb, namely, the spiral part in which the coolant having a relatively low temperature flows clockwise, and the spiral part of the first flow path 110 from the outer edge portion Za to the coupling portion 13B as the coolant outlet, namely, the spiral part in which the coolant having a relatively high temperatures flows clockwise, are located to overlap each other in the vertical direction. As a result, the temperature of the high temperature part and the temperature of the low temperature part are cancelled by each other to alleviate the temperature difference. Similarly, the spiral part of the first flow path 110 from the coupling portion 11A as the coolant inlet to the outer edge portion Za, namely, the spiral part in which the coolant having a relatively low temperature flows counterclockwise, and the spiral part of the second flow path 210 from the outer edge portion Zb to the coupling portion 12B as the coolant outlet, namely, the spiral part in which the coolant having a relatively high temperatures flows counterclockwise, are located to overlap each other in the vertical direction. As a result, the temperature of the low temperature part and the temperature of the high temperature part are cancelled by each other to alleviate the temperature difference.

The first flow path 110 and the second flow path 210 are structured such that the coupling portion 11B and the coupling portion 12A are located at substantially matching positions of the first substrate 101 and the second substrate 201, and such that the coupling portion 13A and the coupling portion 12B are located at substantially matching positions of the first substrate 101 and the second substrate 201. Therefore, when the coolant flows into the first flow path 110 and the second flow path 210, the coolant flows counterclockwise in the first flow path 110 from the coolant inlet to the outer edge portion Za, whereas the coolant flows in the second flow path 210 clockwise from the coolant inlet to the outer edge portion Zb. Thus, opposing flows are formed in the first cooling plate 100 and the second cooling plate 200 located to overlap each other in the vertical direction. Similarly, the coolant flows clockwise in the first flow path 110 from the outer edge portion Za to the coolant outlet, whereas the coolant flows in the second flow path 210 counterclockwise from the outer edge portion Zb to the coolant outlet. Thus, opposing flows are formed in the first cooling plate 100 and the second cooling plate 200 located to overlap each other in the vertical direction. Thus, the first flow path 110 and the second flow path 210 form flows of the coolant in opposite directions to each other above and below the heater plate 301 including the heating element 310. In this manner, the heater plate 301 is uniformly heated, and thus the heater plate 301 is not deformed or does not have any other fault due to thermal strain thereof. Such a structure decreases the temperature difference in the entirety of the plate portion 300. This decreases the thermal influence on the wafer placed on the plate portion 300 and thus uniformizes the temperature in the plane of the plate.

As described above, in the first cooling plates 100 and the second cooling plate 200 located above and below the heater plate 301, the first flow path 110 and the second flow path 210 are structured such that the low temperature part and the high temperature part of the coolant overlap each other in the vertical direction and such that the coolant flowing in the first flow path 110 and the coolant flowing in the second flow path 210 flow in the opposite directions. Such a structure allows the heater plate 301 to be heated uniformly. The surface of the plate portion 300 may undesirably have a temperature variance because the temperature of the coolant is lower as being closer to the coolant inlet of each of the first flow path 110 and the second flow path 210 and is higher as being farther from the coolant inlet thereof. However, the above-described structure, in which the temperature difference is alleviated by the first flow path 110 and the second flow path 210, uniformizes the temperature at the surface of the plate portion 300 on which the wafer is to be placed.

As described above, the substrate support device in an embodiment according to the present invention, for heating the wafer, heats the heater plate 301 uniformly to prevent the heater plate 301 from being deformed or from having any other fault due to thermal strain, and also improves the temperature uniformity of the wafer placed on the surface of the plate portion 300 to prevent the wafer from being curved or from having any other fault. Thus, the yield of the semiconductor devices is improved.

The present invention provides a substrate support device that, for heating a wafer, uniformly heats a heater plate so that the heater plate is not deformed or does not have any other fault due to thermal strain, and so that the temperature uniformity of the wafer is improved. Such a substrate support device improves the yield of semiconductor devices.

What is claimed is:

1. A substrate support device, comprising:
a plate portion including a heater plate including a heating element provided in the heater plate, a first cooling plate provided on a bottom surface of the heater plate and having a first flow path, and a second cooling plate provided on a top surface of the heater plate and having a second flow path; and
a shaft portion supporting the plate portion and including a line connected to the heating element to supply an electric current to the heating element, and a tube supplying a coolant to the first cooling plate and the second cooling plate, the line and the tube being provided inside the shaft portion;
wherein:
the first flow path includes a spiral flow path wound circumferentially in a first direction from a central area toward an outer edge portion of the first cooling plate; and
the second flow path includes a spiral flow path wound circumferentially in a second direction from a central area toward an outer edge portion of the second cooling plate, the second direction being opposite to the first direction.

2. The substrate support device according to claim 1, further comprising a first coupling tube coupling the first flow path and the second flow path to each other to supply the coolant from the first flow path to the second flow path;
wherein the first flow path includes a portion bent horizontally at a first angle at a position where the first flow path is coupled with the first coupling tube.

3. The substrate support device according to claim 2, further comprising a second coupling tube coupling the first flow path and the second flow path to each other to supply the coolant from the second flow path to the first flow path;
wherein the first flow path includes a portion bent horizontally at a second angle at a position where the first flow path is coupled with the second coupling tube.

4. The substrate support device according to claim 3, wherein the first angle and the second angle are each 90 degrees.

5. The substrate support device according to claim 1, wherein:
the first flow path further includes a spiral flow path coupled at the outer edge portion with the spiral flow path wound circumferentially in the first direction, and wound circumferentially in the second direction from the outer edge portion toward the central area;
the second flow path further includes a spiral flow path coupled at the outer edge portion with the spiral flow path wound circumferentially in the second direction, and wound circumferentially in the first direction from the outer edge portion toward the central area;
the spiral flow path, of the first flow path, wound circumferentially in the first direction, and the spiral flow path, of the second flow path, wound circumferentially in the first direction, are located to overlap each other at least partially; and
the spiral flow path, of the first flow path, wound circumferentially in the second direction, and the spiral flow path, of the second flow path, wound circumferentially in the second direction, are located to overlap each other at least partially.

6. The substrate support device according to claim 1, wherein the second flow path has a cross-sectional area larger than a cross-sectional area of the first flow path.

7. The substrate support device according to claim 2, wherein:
the first flow path further includes a spiral flow path coupled at the outer edge portion with the spiral flow path wound circumferentially in the first direction, and wound circumferentially in the second direction from the outer edge portion toward the central area;
the second flow path further includes a spiral flow path coupled at the outer edge portion with the spiral flow path wound circumferentially in the second direction, and wound circumferentially in the first direction from the outer edge portion toward the central area;
the spiral flow path, of the first flow path, wound circumferentially in the first direction, and the spiral flow path, of the second flow path, wound circumferentially in the first direction, are located to overlap each other at least partially; and
the spiral flow path, of the first flow path, wound circumferentially in the second direction, and the spiral flow path, of the second flow path, wound circumferentially in the second direction, are located to overlap each other at least partially.

8. The substrate support device according to claim 3, wherein:
the first flow path further includes a spiral flow path coupled at the outer edge portion with the spiral flow path wound circumferentially in the first direction, and wound circumferentially in the second direction from the outer edge portion toward the central area;
the second flow path further includes a spiral flow path coupled at the outer edge portion with the spiral flow path wound circumferentially in the second direction, and wound circumferentially in the first direction from the outer edge portion toward the central area;
the spiral flow path, of the first flow path, wound circumferentially in the first direction, and the spiral flow path, of the second flow path, wound circumferentially in the first direction, are located to overlap each other at least partially; and
the spiral flow path, of the first flow path, wound circumferentially in the second direction, and the spiral flow path, of the second flow path, wound circumferentially in the second direction, are located to overlap each other at least partially.

9. The substrate support device according to claim 4, wherein:
the first flow path further includes a spiral flow path coupled at the outer edge portion with the spiral flow path wound circumferentially in the first direction, and wound circumferentially in the second direction from the outer edge portion toward the central area;
the second flow path further includes a spiral flow path coupled at the outer edge portion with the spiral flow path wound circumferentially in the second direction, and wound circumferentially in the first direction from the outer edge portion toward the central area;

the spiral flow path, of the first flow path, wound circumferentially in the first direction, and the spiral flow path, of the second flow path, wound circumferentially in the first direction, are located to overlap each other at least partially; and the spiral flow path, of the first flow path, wound circumferentially in the second direction, and the spiral flow path, of the second flow path, wound circumferentially in the second direction, are located to overlap each other at least partially.

10. The substrate support device according to claim 2, wherein the second flow path has a cross-sectional area larger than a cross-sectional area of the first flow path.

11. The substrate support device according to claim 3, wherein the second flow path has a cross-sectional area larger than a cross-sectional area of the first flow path.

12. The substrate support device according to claim 4, wherein the second flow path has a cross-sectional area larger than a cross-sectional area of the first flow path.

13. The substrate support device according to claim 5, wherein the second flow path has a cross-sectional area larger than a cross-sectional area of the first flow path.

* * * * *